(12) United States Patent
Rollinger

(10) Patent No.: US 9,551,839 B2
(45) Date of Patent: Jan. 24, 2017

(54) OPTICAL COMPONENT INCLUDING NANOPARTICLE HEAT SINK

(71) Applicant: Raytheon Company, Waltham, MA (US)

(72) Inventor: Andrew R. Rollinger, Newbury Park, CA (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 14/674,168

(22) Filed: Mar. 31, 2015

(65) Prior Publication Data

US 2016/0291256 A1    Oct. 6, 2016

(51) Int. Cl.
| | | |
|---|---|---|
| G02B 6/36 | (2006.01) | |
| G02B 6/255 | (2006.01) | |
| G02B 6/02 | (2006.01) | |
| H05K 7/20 | (2006.01) | |

(52) U.S. Cl.
CPC ............. *G02B 6/36* (2013.01); *G02B 6/02042* (2013.01); *G02B 6/255* (2013.01); *H05K 7/20418* (2013.01)

(58) Field of Classification Search
CPC ... H05K 7/20418; G02B 6/36; G02B 6/02042; G02B 6/255
See application file for complete search history.

(56) References Cited

U.S. PATENT DOCUMENTS

| | | | |
|---|---|---|---|
| 4,119,363 A | 10/1978 | Camlibel et al. | |
| 4,509,820 A | 4/1985 | Murata et al. | |
| 4,828,351 A | 5/1989 | Beinhaur | |
| 4,961,624 A | 10/1990 | Savitsky et al. | |
| 5,337,390 A | 8/1994 | Henson et al. | |
| 5,422,971 A | 6/1995 | Honjo et al. | |
| 5,898,715 A * | 4/1999 | LeGrange | G02B 6/262 372/6 |
| 6,338,579 B1 * | 1/2002 | Winiarski | G02B 6/4471 385/68 |
| 6,567,452 B2 * | 5/2003 | Byren | H01S 3/09415 372/34 |

(Continued)

FOREIGN PATENT DOCUMENTS

| | | |
|---|---|---|
| DE | 102012108828 A1 | 3/2014 |
| EP | 2083297 A1 | 7/2009 |

(Continued)

OTHER PUBLICATIONS

International Search Report and Written Opinion; PCT Application No. PCT/US2016/015248; International Filing Date: Jan. 28, 2016; Date of Mailing: Apr. 1, 2016; 11 pages.

*Primary Examiner* — Peter Radkowski
(74) *Attorney, Agent, or Firm* — Cantor Colburn LLP

(57) ABSTRACT

An optical fiber assembly includes at least one optical component configured to deliver light from a first end to a second end opposite the first end. The at least one optical component includes at least one localized heat-sensitive area that emits increased temperatures with respect to remaining areas of the at least one optical fiber in response to light traveling through the localized heat-sensitive area. The optical fiber assembly further includes a nanoparticle heat sink that contacts the optical component and that completely surrounds the localized heat-sensitive area such that the nanoparticle heat sink dissipates heat from the at least one optical component.

5 Claims, 13 Drawing Sheets

(56) References Cited

U.S. PATENT DOCUMENTS

| | | | |
|---|---|---|---|
| 6,646,793 B2 * | 11/2003 | Bruesselbach | H01S 3/063 359/342 |
| 7,010,204 B2 * | 3/2006 | Reith | G02B 6/03627 385/128 |
| 7,087,523 B2 | 8/2006 | Grigoropoulos et al. | |
| 7,215,860 B2 * | 5/2007 | Engelberth | G02B 6/02 385/127 |
| 7,261,143 B2 | 8/2007 | Chen | |
| 7,551,823 B2 * | 6/2009 | Reith | G02B 6/03627 385/123 |
| 7,926,554 B2 | 4/2011 | Tung et al. | |
| 8,542,971 B2 * | 9/2013 | Chatigny | G02B 6/3636 385/134 |
| 8,811,789 B2 * | 8/2014 | Reith | G02B 6/03627 385/126 |
| 8,900,704 B1 * | 12/2014 | Zinn | H01L 23/373 361/708 |
| 9,116,296 B2 * | 8/2015 | Fisher | G02B 6/14 |
| 2002/0101893 A1 * | 8/2002 | Bruesselbach | H01S 3/063 372/41 |
| 2003/0031226 A1 * | 2/2003 | Byren | H01S 3/09415 372/66 |
| 2003/0231845 A1 * | 12/2003 | Patlakh | G02B 6/02352 385/125 |
| 2004/0071388 A1 * | 4/2004 | Benzoni | G02B 6/12 385/14 |
| 2004/0175086 A1 * | 9/2004 | Reith | G02B 6/03627 385/128 |
| 2006/0062532 A1 * | 3/2006 | Reith | G02B 6/03627 385/123 |
| 2006/0245707 A1 * | 11/2006 | Engelberth | G02B 6/02 385/127 |
| 2007/0206909 A1 | 9/2007 | Wetter et al. | |
| 2009/0175301 A1 * | 7/2009 | Li | G02B 6/2835 372/6 |
| 2009/0238526 A1 * | 9/2009 | Reith | G02B 6/03627 385/128 |
| 2011/0110625 A1 * | 5/2011 | Chatigny | H01S 3/06704 385/29 |
| 2011/0249935 A1 * | 10/2011 | Hu | G02B 6/14 385/27 |
| 2013/0011102 A1 * | 1/2013 | Rinzler | G02B 6/4296 385/89 |
| 2013/0242368 A1 * | 9/2013 | Ofir | C09J 133/08 359/241 |
| 2014/0105545 A1 * | 4/2014 | Danley | G02B 6/3854 385/78 |
| 2014/0211818 A1 * | 7/2014 | Hou | H01S 3/094007 372/6 |
| 2014/0270667 A1 * | 9/2014 | Holland | C03B 37/01211 385/123 |
| 2015/0049983 A1 * | 2/2015 | Fisher | G02B 6/14 385/29 |
| 2015/0054020 A1 | 2/2015 | Paolella et al. | |

FOREIGN PATENT DOCUMENTS

| | | |
|---|---|---|
| JP | 2008198637 A * | 8/2008 |
| JP | 2013167758 A | 8/2013 |

* cited by examiner ns such as, for example, optical fibers and/or optical fiber
OPTICAL COMPONENT INCLUDING NANOPARTICLE HEAT SINK

BACKGROUND

The present disclosure relates to optical components, and more specifically, to an optical component having one or more nanoparticle heat sinks.

Optical fiber assemblies traditionally use optical components such as, for example, optical fibers and/or optical fiber couplers, to convey optical light along a desired optical path. With respect to laser beam applications, power levels can reach anywhere from 2 watts (W) to 1000 kW, for example. Laser beams, however, can generate temperature increases at various localized areas of the optical fiber assembly. Conventional optical fiber assemblies typically implement heat sinks configured to dissipate heat across a broad area of the optical fiber. These conventional heat sinks, however, are not successful at dissipating heat at localized or concentrated areas of the optical fiber.

In applications where two or more optical fibers are spliced together, for example, localized heat areas are typically found at the interface between spliced cores within the optical fibers. Over time, the increased temperatures can weaken the optical fibers and induce cracking at the splice interface of the cores which reduces performance and quality of the overall optical fiber assembly. In cases where optical couplers are utilized, an optical fiber is supported within a thermally conductive housing. An epoxy is typically used to retain the input end of the optical fiber to the housing. When delivering laser light to the optical fiber, a portion of the laser light can impinge on an exterior surface of the housing such that localized heating occurs at the laser light entry point. The increased temperatures can crack the input end of the optical fiber and also burn the epoxy causing the optical fiber retention to be weakened or damaged. In addition, epoxy tends to undergo outgassing when heated which can contaminate the surfaces of optical components.

SUMMARY

According to a non-limiting embodiment, an optical fiber assembly includes at least one optical component configured to deliver light from a first end to a second end opposite the first end. The at least one optical component includes at least one localized heat-sensitive area that emits increased temperatures with respect to remaining areas of the at least one optical fiber in response to light traveling through the localized heat-sensitive area. The optical fiber assembly further includes a nanoparticle heat sink that contacts the optical component and that completely surrounds the localized heat-sensitive area such that the nanoparticle heat sink dissipates heat from the at least one optical component.

Additional features are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Various embodiments of the invention provide an optical fiber assembly that includes a nanoparticle heat sink. The nanoparticle heat sink is formed against one or more portions of an optical component susceptible to localized heating and increased temperatures. The nanoparticle heat sink contains a plurality of thermally conductive nanoparticles that promote heat dissipation. The nanoparticle heat sink includes a casing that retains the nanoparticles against one or more heat-sensitive areas of the optical component susceptible to localized heating, such as a splice interface between two or more spliced optical fibers. In this manner, heat dissipation at the localized heat-sensitive areas is achieved thereby reducing thermal stress and cracking realized by the optical fiber. Moreover, at least one embodiment provides a nanoparticle heat sink that completely surrounds an optical fiber's exterior surface at one or more areas that realize localized heating. In this manner, heating of the optical fiber is dissipated more evenly thereby increasing power handling abilities of the optical fiber and overall assembly.

Figure 1A:
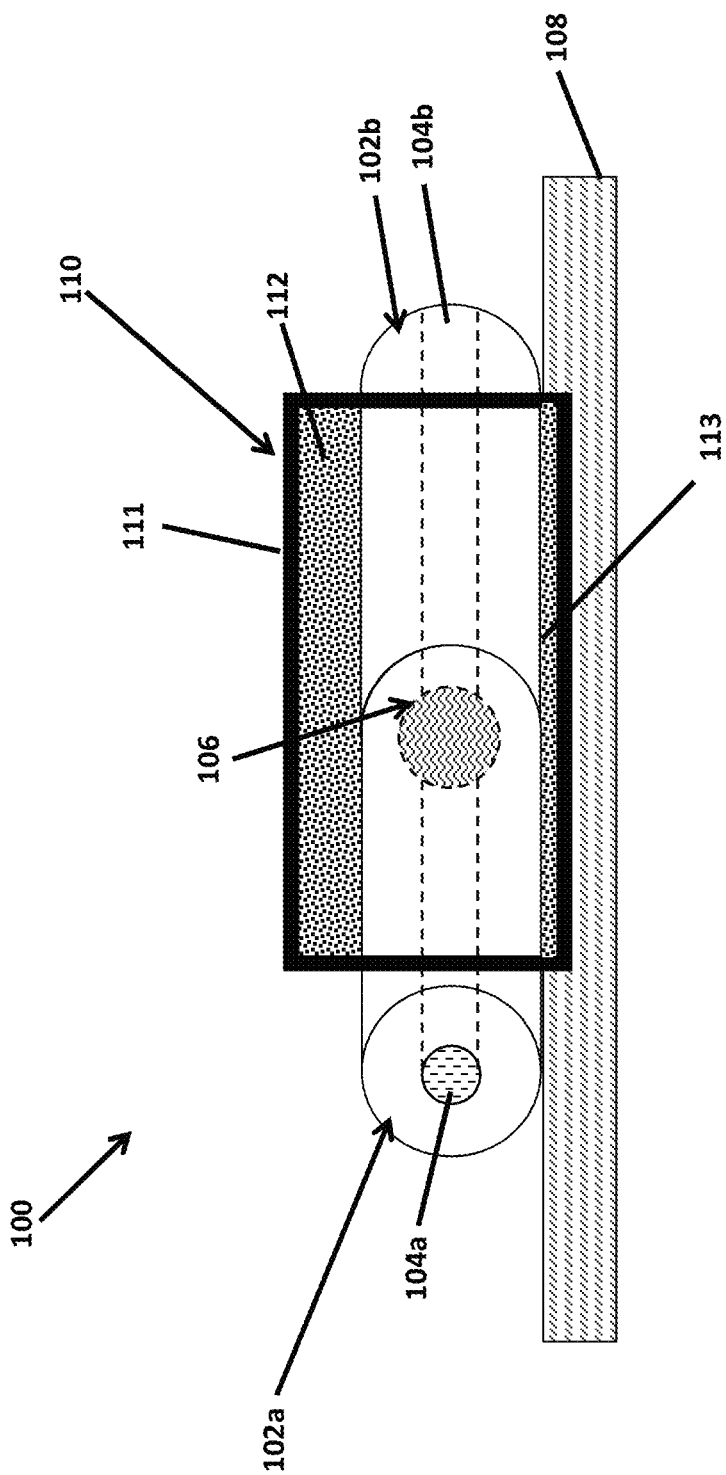
FIG. 1A is a perspective view of an optical fiber assembly including a nanoparticle heat sink formed on a pair of optical fibers spliced together to form a splice interface according to a non-limiting embodiment.

With reference now to FIG. 1A, an optical fiber assembly 100 is illustrated according to a non-limiting embodiment of the invention. The optical fiber assembly 100 includes one or more optical components such as, for example, an optical fiber. According to an embodiment, the optical fiber assembly 100 includes a first optical fiber 102a having a first fiber core 104a and a second optical fiber 102b having a second fiber core 104b. According to at least one embodiment, the first and second optical fibers 102a-102b include high power optical fibers formed from one or more flexible strands of transparent material including, but not limited to, transparent fiber made of glass, extruded glass (silica), and plastic, which are configured to convey optical light such as, for example, laser light, therethrough.

The first fiber core 104a is spliced together with the second fiber core 104b to form a splice interface 106. Various methods for splicing together the fiber cores 104a-104b may be used as understood by one or ordinary skill in the art. In this embodiment, for example, laser light travels from a first end of the first optical fiber 102a, through the splice interface 106a, and to a second end of the second optical fiber 102b. The splice interface 106 may form a heat-sensitive area susceptible to localized heating when a high power optical signal, such as laser light, travels therethrough.

According to a non-limiting embodiment, the optical fiber assembly 100 further includes a heat sink 108 coupled to a bottom portion of the first and second optical fiber assemblies 102a-102b. In this manner, the first and second optical fibers 102a-102b can directly contact the heat sink 108. The heat sink 108 may be formed from various thermally conductive materials including, but not limited to, a metal material. In this manner, heat generally emitted from external surface of the optical fibers 102a-102b can be dissipated from the optical fibers 102a-102b accordingly.

The optical fiber assembly 100 further includes a nanoparticle heat sink 110. The nanoparticle heat sink 110 has a casing 111 that is coupled to the heat sink 108 and defines an inner volume that contains a plurality of nanoparticles 112. The casing 111 may further include a groove 113 in which the optical fibers 102a-102b can fit therein. In this manner one or more portions of the optical fibers 102a-102b can be embedded in the nanoparticles 112. According to at least one embodiment, the casing 111 is positioned with respect to one or more areas of the first and second optical fibers 102a-102b that are susceptible to localized heating. As further shown in FIG. 1A, for example, the casing 111 is positioned with respect to the splice interface 106. As high power optical light, such as laser light, travels through the first and second optical fibers 102a-102b, localized heating occurs at the fiber splice interface 106. The casing 111 can also be formed of a thermally conductive material such that the casing 111 itself is configured as a heat sink having thermal dissipation characteristics.

The nanoparticles 112 are formed from various thermally conductive nanoparticles 112 including, but not limited to, nanoparticles of copper (Cu), nanoparticles of a nickel-cobalt ferrous alloy, diamond, or a combination of other various thermally conductive nanoparticles. The thermally conductive nanoparticles 211 have a size ranging preferably from 1 nanometer (nm) to approximately 10 nm. It is appreciated, however, that the thermally conductive nanoparticles 211 can be sized up to approximately 1 micrometer ($\mu$m), for example, without departing from the scope of the invention. According to a non-limiting embodiment, a mixture of nanoparticles have a thermal coefficient of expansion similar to the material of the optical fibers 102a-102b, e.g., glass. In this manner, expansion-matched seals between metal and glass portions can be achieved. Moreover, fusing nanoparticles having a thermal coefficient of expansion that is similar, or substantially matches, that of the material of the optical fibers 102a-102b which reduces stress and improves power handling abilities at the splice interface 106.

Figure 1B:
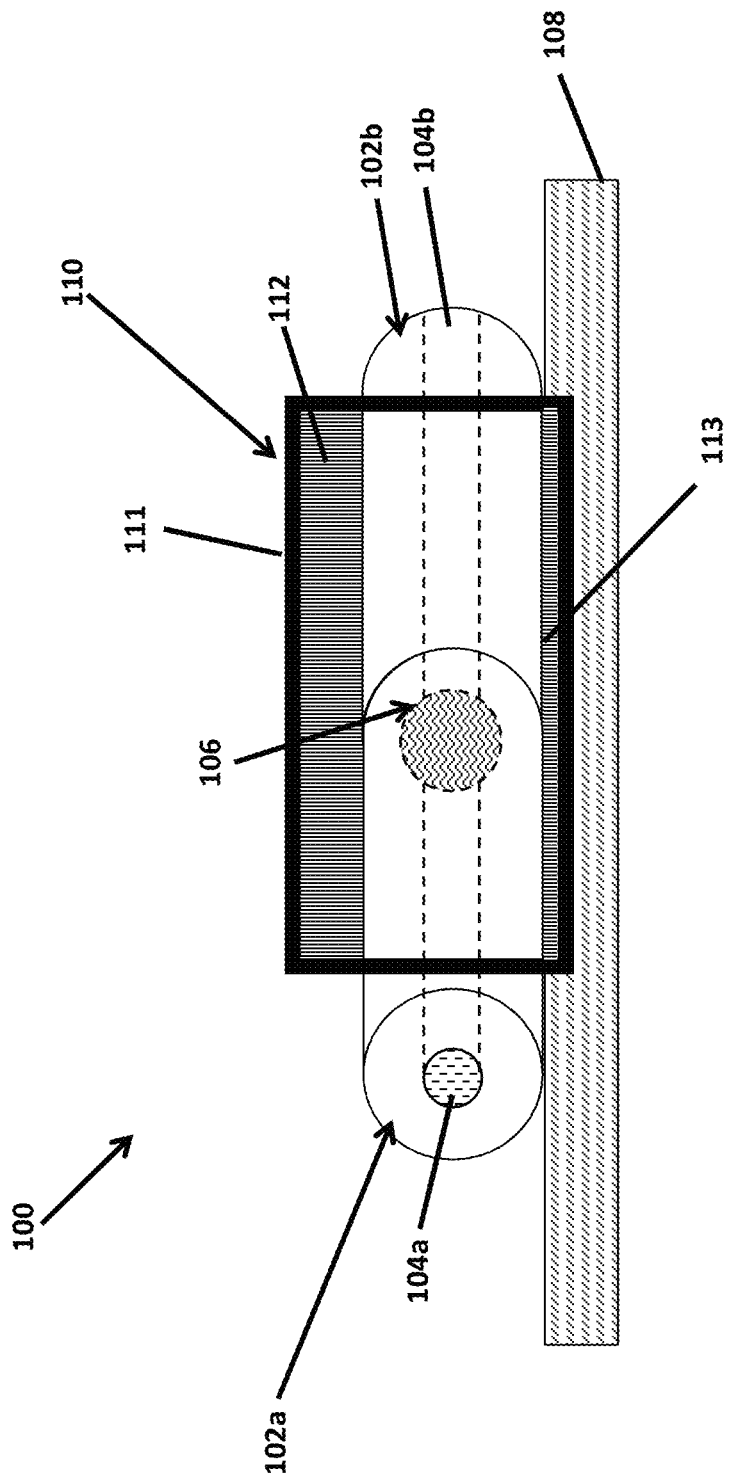
FIG. 1B is a perspective view of an optical fiber assembly including a nanoparticle heat sink formed on a pair of optical fibers spliced together to form a splice interface according to another non-limiting embodiment.

According to an embodiment, the nanoparticles 112 are formed as a powder material that is packed within the casing 111 to surround the optical fibers 102a-102b. In this manner, the optical fiber assembly 100 can be disassembled and a portion of the nanoparticle heat sink 110 (i.e., a portion of the powder nanoparticles 112) can be removed in case future rework of the optical fiber assembly 100 is necessary. According to another embodiment, however, the nanoparticles 112 can be applied using a carrier solution and the subsequently sintering the nanoparticles 112 to prevent oxidation. Another option is to sinter the nanoparticles 112 under vacuum to form a solid thermally-conductive body that is integrally formed with portions of each optical fiber 102a-102b contained within the casing 111 (see FIG. 1B). In either case, one or more areas of the optical fibers 102a-102b susceptible to localized heating (e.g., the splice interface 106) are completely surrounded by the thermally conductive nanoparticles 112. In this manner, heat at localized areas can be effectively transferred to the casing 111 and dissipated from the optical fiber assembly 100. Accordingly, thermal stress and cracking at areas of the optical fibers 102a-102b susceptible to localized heating is reduced. Moreover, the combination of the nanoparticle heat sink 110 and the heat sink 108 reduces hot spots and achieves a more uniform heat dissipation compared to conventional optical fiber assemblies.

According to another embodiment, a liquid solution including nanoparticles 112 can be disposed in the casing 111 and contained therein to surround the optical fibers 102a-102b. Unlike the embodiment described above, the nanoparticles 112 are not sintered. In this matter, extra heat dissipation is provided, while also preventing particle oxidation. The liquid can include, but is not limited to, an oil or other liquid could be used to contain the nanoparticles 112.

Figure 1C:
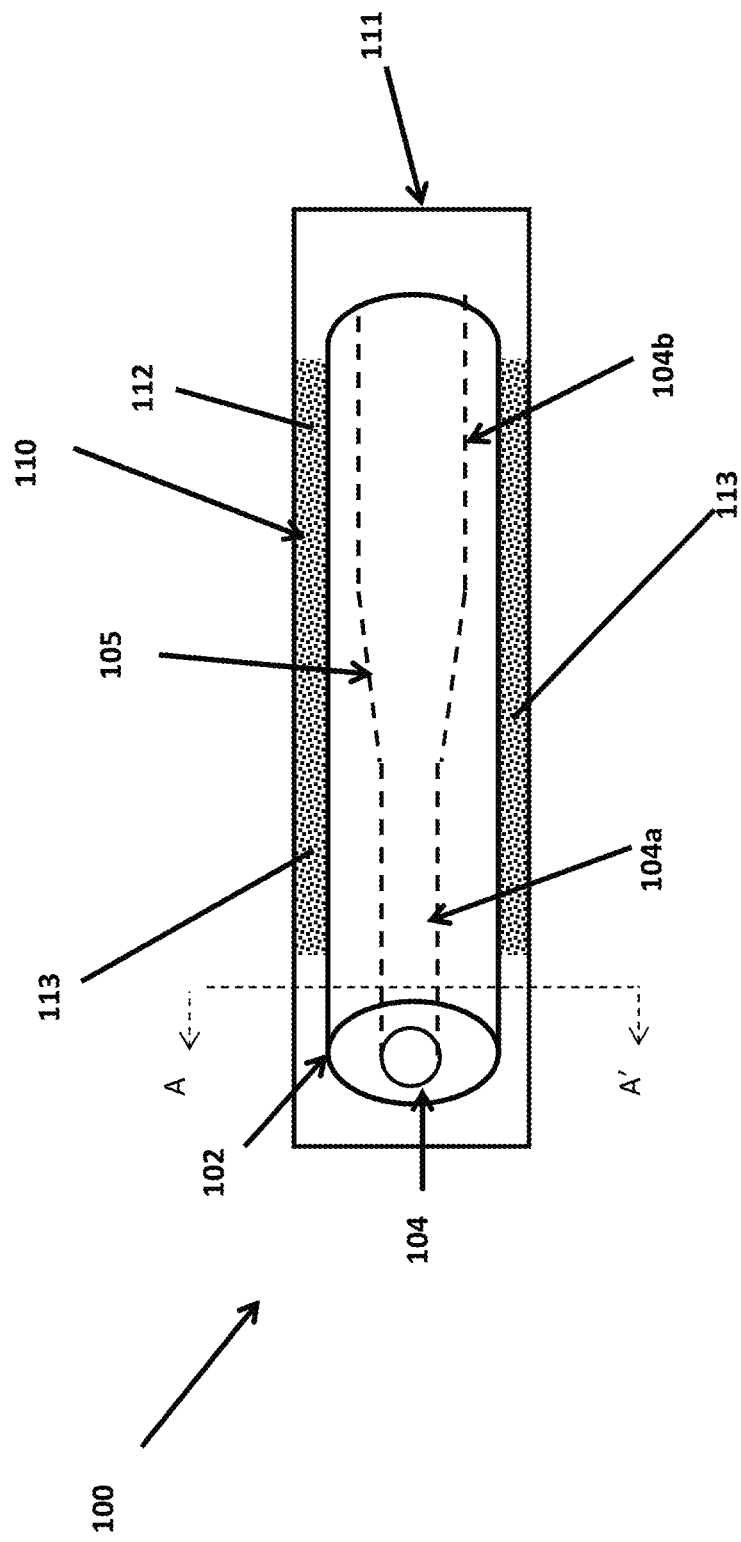
FIG. 1C is a perspective view of an optical fiber assembly including a nanoparticle heat sink formed on a tapered optical fiber according to a non-limiting embodiment.
Figure 1D:
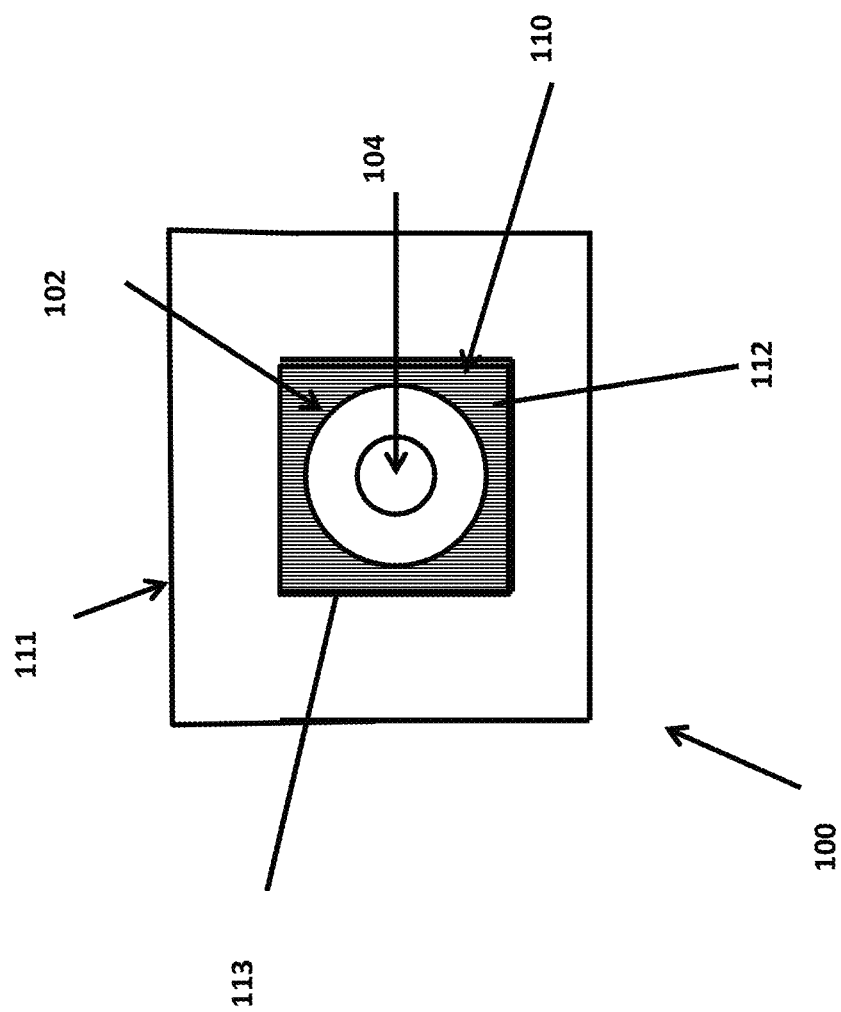
FIG. 1D is a cross-section view of the optical fiber assembly shown in FIG. 1C taken along line A-A'.

Turning to FIGS. 1C-1D, an optical fiber assembly 100 is illustrated according to another non-limiting embodiment. The optical fiber assembly 100 includes an optical fiber 102 having a first fiber core portion 104a and a second fiber core portion 104b. According to at least one embodiment, the first and second optical fibers 102a-102b include high power optical fibers formed from one or more flexible strands of transparent material including, but not limited to, transparent fiber made of glass, extruded glass (silica), and plastic, which are configured to convey optical light such as, for example, laser light, therethrough.

The first fiber core portion 104a has a first diameter and the second fiber core portion 104b includes second diameter that is greater than first diameter. A tapered portion 105 extends between the first fiber core portion 104a and second fiber core portion 104b. In this embodiment, for example, laser light travels from first fiber core portion, through the tapered portion 105, and to the second fiber core portion 104b. The tapered portion 105 may form a heat-sensitive area susceptible to localized heating when a high power optical signal, such as laser light, travels therethrough.

The optical fiber assembly 100 further includes a nanoparticle heat sink 110. The nanoparticle heat sink 110 has a casing 111 that defines an inner volume that contains a plurality of nanoparticles 112. The casing 111 may further include a groove 113 in which the optical fibers 102a-102b can fit therein. In this manner one or more portions of the optical fibers 102a-102b can be embedded in the nanoparticles 112. According to at least one embodiment, the casing 111 is positioned with respect to one or more areas of the first and second optical fibers 102a-102b that are susceptible to localized heating. As further shown in FIGS. 1C-1D, for example, the casing 111 is positioned with respect to the tapered portion 105. As high power optical light, such as laser light, travels through the optical fiber 102, localized heating occurs at the tapered portion 105. Accordingly, the nanoparticles 112 can more effectively dissipate heat from the tapered portion 105. The casing 111 can also be formed of a thermally conductive material such that the casing 111 itself is configured as a heat sink having thermal dissipation characteristics. The nanoparticles 112 can be sized and applied as described in detail above. Further, the nanoparticles 112 can be disposed in the casing 111 in a powder form or as sintered nanoparticles as described in detail above.

Figure 2A:
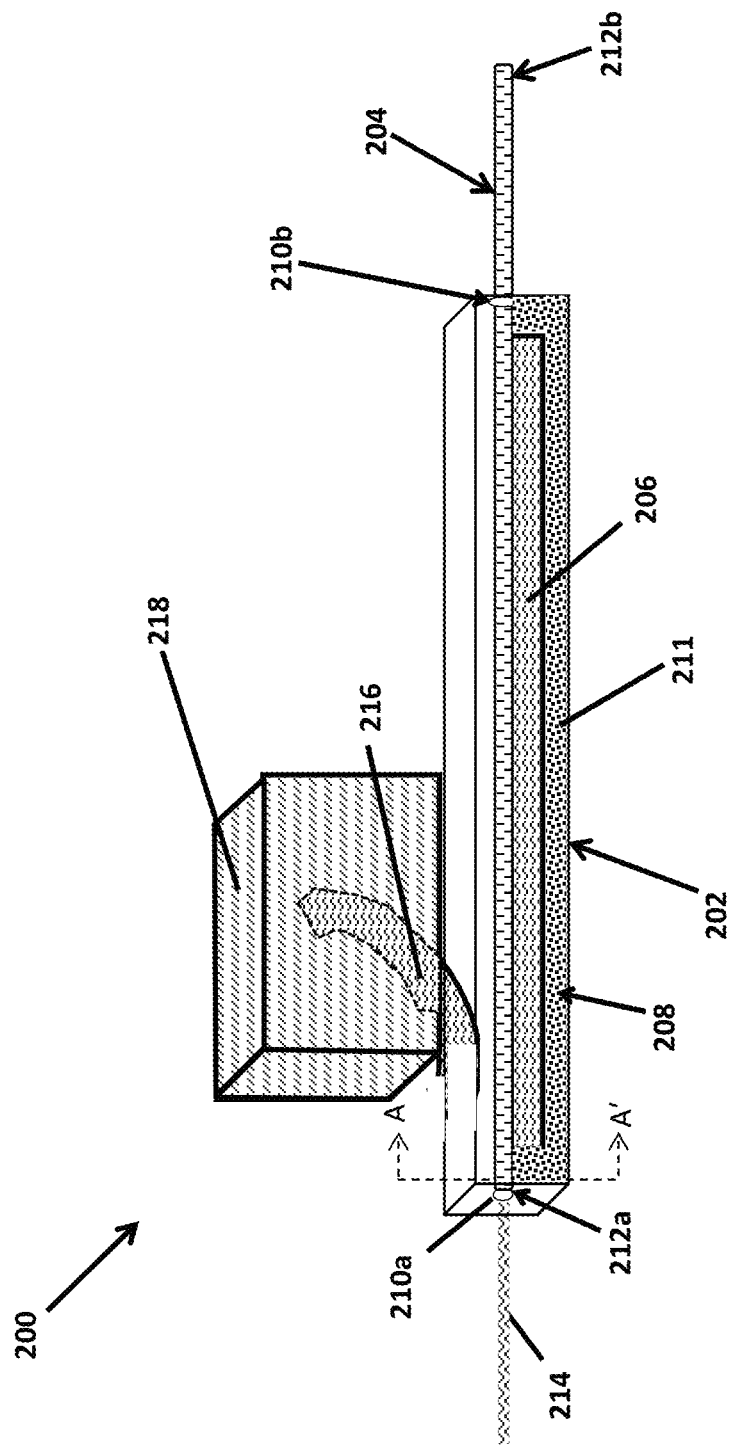
FIG. 2A shows an optical coupler including an integrated nanoparticle heat sink containing an optical fiber and a heat tube assembly to cool the optical fiber according to a non-limiting embodiment.
Figure 2B:
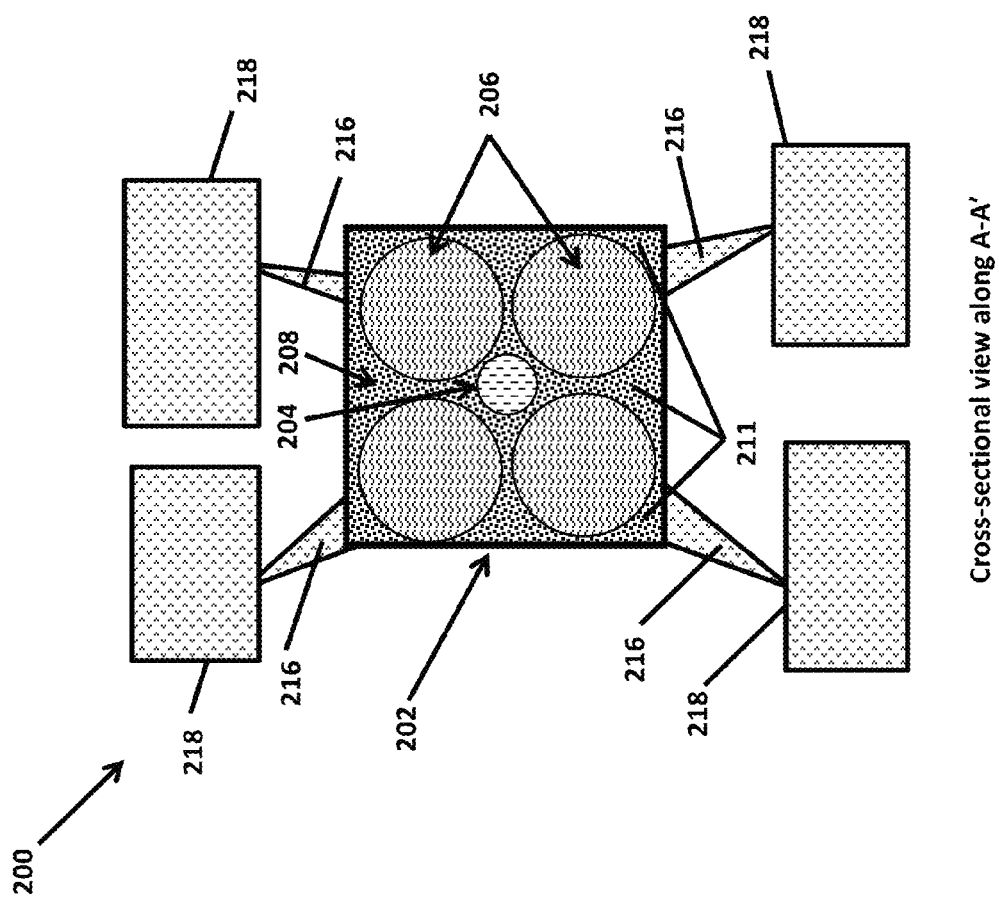
FIG. 2B is a cross-sectional view of the optical coupler of FIG. 2A taken along line A-A' to show the heat tube assembly and optical fiber embedded in the thermally conductive nanoparticles filling the inner-volume of the optical coupler according to a non-limiting embodiment.

Referring to FIGS. 2A-2B, an optical fiber assembly 200 is illustrated according to another non-limiting embodiment. The optical fiber assembly 200 in this case is configured as an optical coupler 200. The optical coupler 200 includes a housing 202 configured to support one or more optical fibers 204, one or more heat pipes 206, and a nanoparticle heat sink 208. The housing 202 extends between an inlet 210a and outlet 210b to define a housing length. The optical fiber 204 is a flexible strand formed from a transparent material including, but not limited to, glass, extruded glass (silica), and plastic. The housing 202 can also be formed of a thermally conductive material such that the casing 202 itself is configured as a heat sink having thermal dissipation characteristics.

The optical fiber 204 extends between an input end 212a and an output end 212b to define a fiber length. The input end 212a is aligned with a housing inlet 210a, and the output end 212b is aligned with a housing outlet 210b. The input end 212a and the output end 212b are coupled to the housing inlet 210a and housing outlet 210b, respectively. Optical light, such as laser light 214 for example, enters the housing inlet 210a and is received at the input end 212a where it is delivered along the length of the optical fiber 204 and delivered to the output end 212b.

One or more heat pipes 206 are disposed within the housing 202 and are arranged to contact the outer surface of the optical fiber 204. The heat pipes 206 receive heat from the exterior surface of the optical fiber 204 and are configured to perform a thermal cycle that removes the heat from the optical fiber 204. The optical coupler 200 of the present invention, however, includes a nanoparticle heat sink 208 that is embedded within the housing 202 and completely surrounds an area of the optical fiber 204 that is susceptible to localized heating.

It is common for a portion of the laser light 214 entering the housing inlet 210a to impinge on an exterior surface of the housing 202. As a result, increased temperatures are typically localized at the housing inlet 210a and the input end 212a. The nanoparticle heat sink 208, however, includes a plurality of thermally conductive nanoparticles 211 that completely surround the housing inlet 210a and contact all surfaces of the input end 212a as further illustrated in FIG. 2B. The thermally conductive nanoparticles 211 have a size ranging preferably from 1 nanometer (nm) to approximately 10 nm. It is appreciated, however, that the thermally conductive nanoparticles 211 can be sized up to approximately 1 micrometer (μm) without departing from the scope of the invention.

According to an embodiment, the nanoparticles 211 are formed as a powder material that is packed within the housing 202 to surround the optical fiber 204. In this manner, the optical coupler 200 can be disassembled and a portion of the nanoparticle heat sink 208 (i.e., a portion of the powder nanoparticles 211) can be removed in case future rework of the optical coupler 200 is necessary. According to another embodiment, however, the nanoparticles 211 can be melted down to form a solid thermally-conductive body that is integrally formed with the optical fiber 204 contained within the housing 202. In either case, one or more heat-sensitive areas susceptible to localized heating (e.g., the input end 212a) are completely surrounded by the thermally conductive nanoparticles 211. Therefore, the localized heat at the input end 212a, for example, is effectively dissipated thereby reducing thermal stress on the optical fiber 204. Moreover, the nanoparticles 211 completely surround the outer surfaces of the heat pipes 206. Therefore, cool temperatures expelled by the heat pipes 206 can be quickly transferred to the outer surface of the housing 202 and effectively expelled from the optical coupler 200.

According to another embodiment, a liquid solution including nanoparticles 211 can be disposed in the housing 202 and contained therein to surround the optical fiber 204. Unlike the embodiment described above, the nanoparticles 211 are not sintered. In this matter, extra heat dissipation is provided, while also preventing particle oxidation. The liquid can include, but is not limited to, an oil or other liquid could be used to contain the nanoparticles 211.

As further illustrated in FIG. 2A, at least one embodiment may include one or more heat pipes 206 having an end that is integrally formed directly to a thermally conductive fin 216. The fin 216 can also be integrally formed with an external heat sink 218 located at an external area of the housing 202. The fin 216 and heat sink 218 are formed from various thermally conductive materials including, for example, copper (Cu). Heat from a heat pipe 206 is transferred to a respective fin 216 and delivered to the heat sink 218, where the heat is evenly distributed across the surface area and released therefrom to further promote cooling of the heat pipe 206. It is appreciated that the fin 216 alone can also expel heat to the exterior area of the housing 202. According to another embodiment, the fin 216 can be formed from a heat pipe or have heat pipe embedded inside the fin 216 which can improve heat transfer to the external heat sink 218.

As further illustrated in FIG. 2B, the fin 216/heat sink 218 combinations can be arranged to define a flower-like shape that surrounds the housing 202. It is appreciated, however, that the fin 216/heat sink 218 combinations can be arranged to define various other shapes without departing from the scope of the invention.

Figure 3:
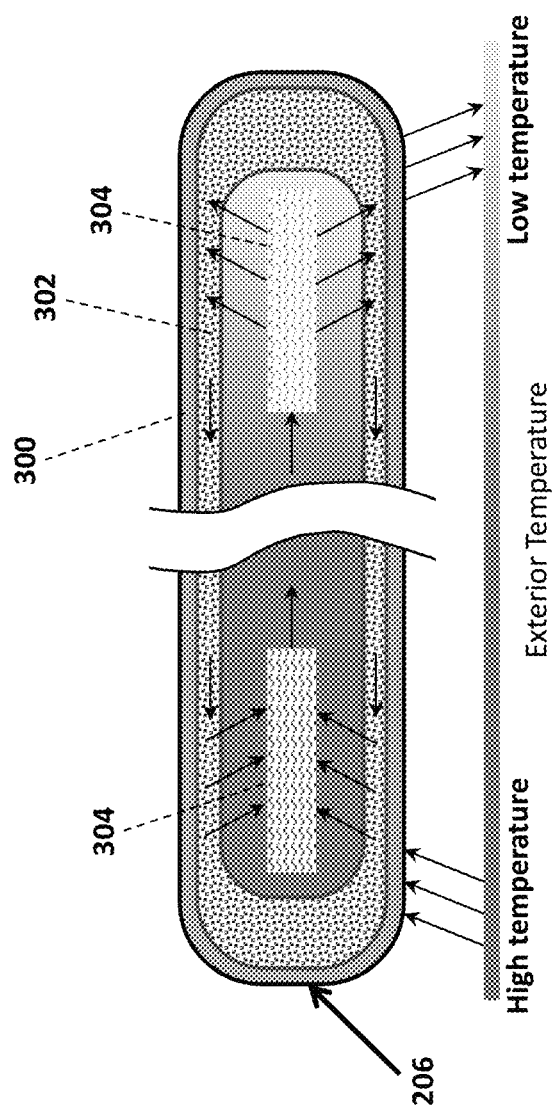
FIG. 3 is a cross-sectional view of a heat tube included in an optical coupler according to a non-limiting embodiment.

Referring now to FIG. 3, a heat pipe 206 included in the optical coupler 200 is illustrated according to a non-limiting embodiment. The heat pipe 206 includes an outer casing 300 and a wick structure 302. The outer casing 300 is formed from various thermally conductive materials including, but not limited to, metal. The wick structure 302 is formed against the inner walls of the casing 300 and defines an inner vapor cavity 304. The wick 302 can be formed as various structures including, but not limited to, a sintered metal powder, a screen, and a plurality of grooved wicks which have a series of grooves parallel to the pipe axis as understood by one of ordinary skill in the art.

The heat pipe 206 is sealed with a working fluid partially filled therein. The working fluid can include any fluid that is capable containing both vapor and liquid over the operating range of the optical fiber 204. The heat from the optical fiber 204 is absorbed by the heat pipe 206 and used to evaporate the working fluid. At the hot interface oft heat pipe 206 a liquid in contact with a thermally conductive solid surface turns into a vapor by absorbing heat from that surface. The vapor then travels along the heat pipe 206 to the cold interface and condenses back into a liquid—releasing the latent heat. The liquid then returns to the hot interface through capillary action (e.g., via the wick 302), centrifugal force, or gravity, and the cycle repeats. Although a vapor-cavity type heat pipe 206 is described, it is appreciated that other types of heat pipes such as, for example, circulating cooling liquid heat pipes, can be used.

Turning now to FIGS. 4A-4E, an optical fiber assembly 400 formed as an optical fiber harness 400 is illustrated according to a non-limiting embodiment. The optical fiber harness 400 includes a frayed multi-core optical fiber 402 and a solid multi-core optical fiber 404. The frayed multi-core optical fiber 402 and the solid multi-core optical fiber 404 are formed from one or more flexible strands of transparent material including, but not limited to, transparent fiber made of glass, extruded glass (silica), and plastic, which are configured to convey optical light such as, for example, laser light, therethrough.

The frayed multi-core optical fiber 402 and the solid multi-core optical fiber 404 each include a plurality of fiber cores 406a and 406b, respectively. Although the multi-core optical fibers 402-404 are shown having seven cores 406a-406b, it is appreciated that the multi-core fibers 402-404 can have more or less cores 406a-406b. The frayed multi-core optical fiber 402 further includes a plurality of loose ends 408a-408g defining voids therebetween. Each loose end 408a-408g includes a respective fiber core 406a disposed therein (see FIG. 4B). Unlike the frayed multi-core optical fiber 402 that includes a plurality of loose-end optical fibers 408a-408g, the solid multi-core optical fiber 404 is a single optical fiber that bundles the plurality of fiber cores 406b therein. Each individual fiber core 406a of the frayed multi-core optical fiber 402 is spliced together with corresponding fiber core 406b contained in the solid multi-core optical fiber 404 to form a plurality of splice interfaces. Accordingly, the frayed multi-core optical fiber 402 and the solid multi-core optical fiber 404 are essentially spliced together at a node 409. In addition, some multi-core fibers can be fused or pulled from multiple fibers that exclude a splice at that point (not shown), but may have a splice at a different point to connect another multi core fiber (not shown).

Figure 4A:
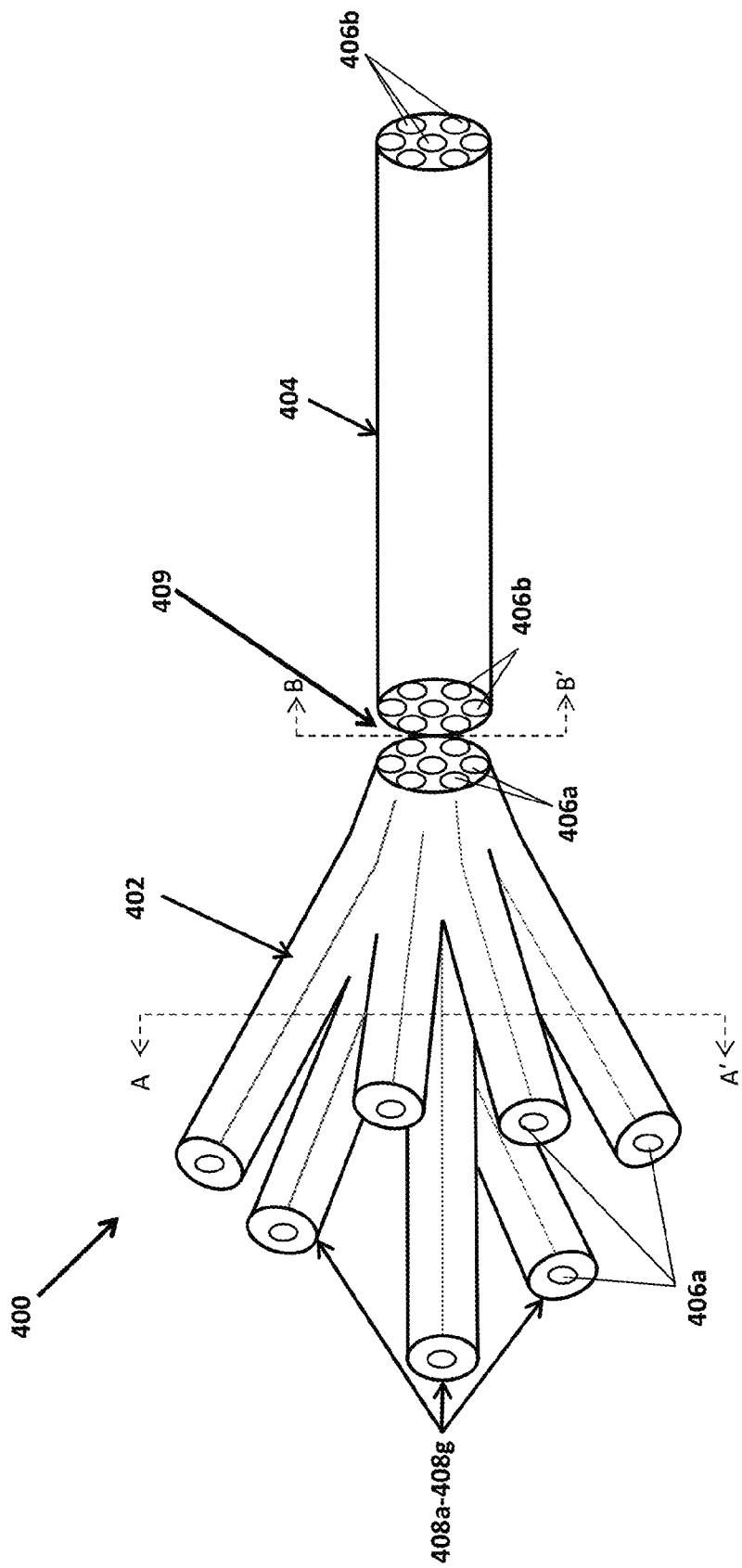
FIG. 4A is a disassembled view of an optical fiber harness including a frayed multi-core optical fiber having a plurality of loose fiber ends and a solid multi-core optical fiber that can be spliced to the frayed multi-core optical fiber.
Figure 4B:
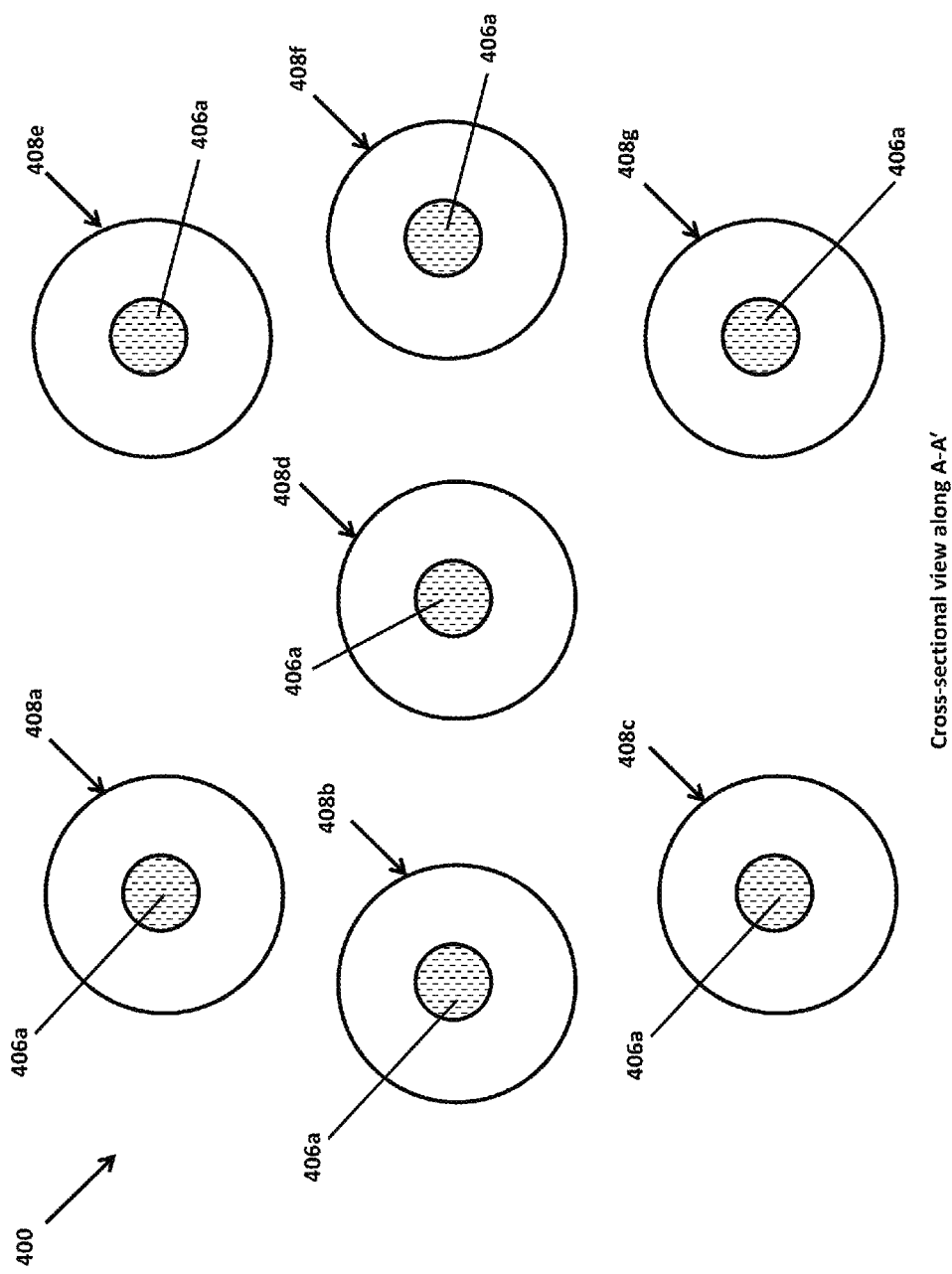
FIG. 4B is a cross-sectional view of loose fiber ends illustrated in FIG. 4A taken along line A-A'.
Figure 4C:
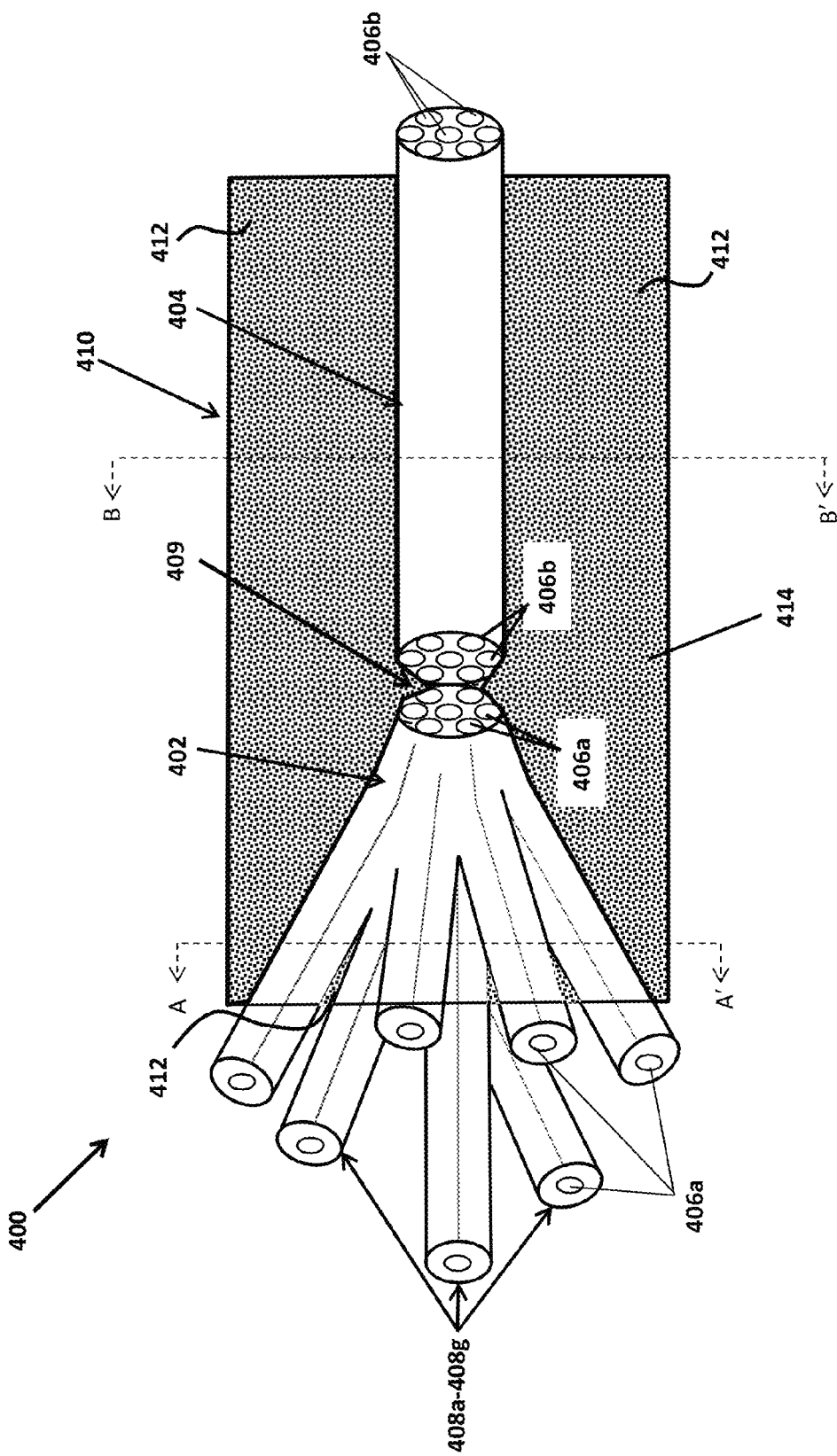
FIG. 4C illustrates the optical fiber harness of FIG. 4A including a nanoparticle heat sink that retains thermally conductive nanoparticles around the frayed multi-core optical fiber and the solid multi-core optical fiber.

Referring to FIG. 4C, an optical fiber harness 400 including a nanoparticle heat sink 410 is illustrated according to a non-limiting embodiment. The nanoparticle heat sink 410 is configured to retain thermally conductive nanoparticles 412 around the frayed multi-core optical fiber 402 and the solid multi-core optical fiber 404. The thermally conductive nanoparticles 412 can be formed from various thermally conductive materials including, but not limited to, copper (Cu), a nickel-cobalt ferrous alloy, diamond, or a combination of other various thermally conductive nanoparticles which promote uniform heat dissipation from the optical fibers 402-404. The thermally conductive nanoparticles 412 may also have a size ranging preferably from 1 nanometer (nm) to approximately 10 nm. It is appreciated, however, that the thermally conductive nanoparticles 412 can be sized up to approximately 1 micrometer (μm) without departing from the scope of the invention.

According to an embodiment, the nanoparticle heat sink 410 includes a casing 414 that contains the thermally conductive nanoparticles 412 therein. The casing 414 can be formed from a thermally conductive material such that the casing 414 itself is configured as a heat sink having thermal dissipation characteristics. In this manner, the thermally conductive nanoparticles 412 are retained against the outer surfaces of the frayed multi-core optical fiber 402 and the solid multi-core optical fiber 404. In this manner, the thermally conductive nanoparticles can be retained completely around node 409 which is susceptible to localized heating. The nanoparticles 412 may also have a thermal coefficient of expansion that matches, or is similar to, the material (e.g. glass) of the optical fibers 402-404. In this manner, expansion-matched seals between metal and glass portions can be achieved which reduces stress and improves power handling abilities at node 409.

According to an embodiment, the nanoparticles 412 are formed as a powder material that is packed within the casing 414 and within the voids existing between portions of the loose optical fibers 408a-408g. In this manner, the optical fiber harness 400 can be disassembled and a portion of the nanoparticle heat sink 410 (i.e., a portion of the powdered nanoparticles 412) can be removed for future harness rework. According to another embodiment, however, the nanoparticles 412 can be melted down or sintered to form a solid thermally-conductive body. In this manner, the thermally-conductive body is integrally formed with the frayed multi-core optical fiber 402 and the solid multi-core optical fiber 404.

According to another embodiment, a liquid solution including nanoparticles 412 can be disposed in the casing 414 and contained therein to surround the optical fibers 402-404. Unlike the embodiment described above, the nanoparticles 412 are not sintered. In this matter, extra heat dissipation is provided, while also preventing particle oxidation. The liquid can include, but is not limited to, an oil or other liquid could be used to contain the nanoparticles 412.

Figure 4D:
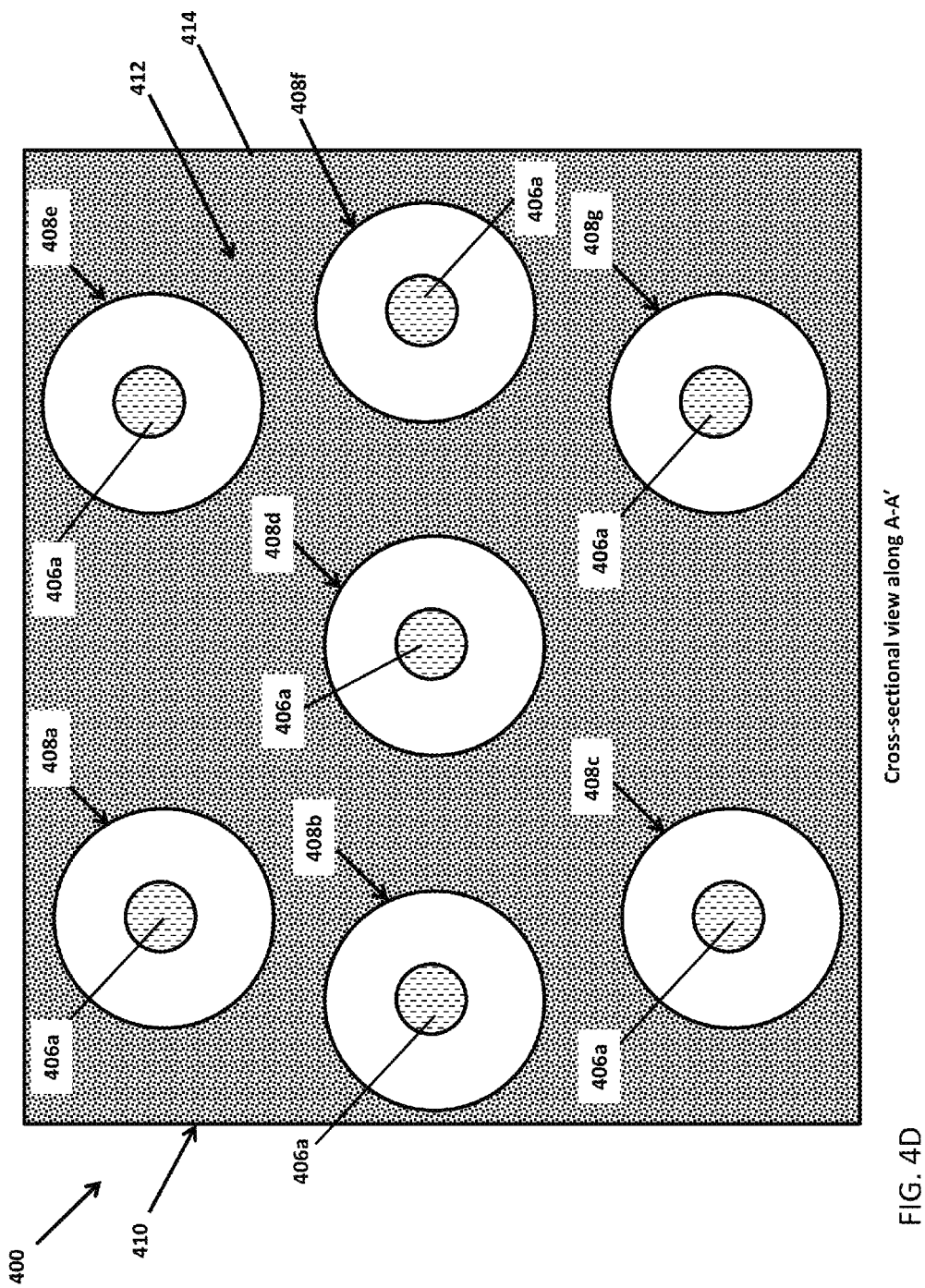
FIG. 4D is a cross-sectional view of the loose-end portion of the optical fiber harness illustrated in FIG. 4C taken along line A-A' and showing the loose fiber ends of the optical fiber harness embedded in the thermally conductive nanoparticles.

Referring to FIG. 4D, a cross-sectional view of the frayed multi-core optical fiber 402 taken along line A-A' is illustrated according to a non-limiting embodiment. The frayed multi-core optical fiber 402 includes a plurality of loose optical fibers 408a-408g embedded in the thermally conductive nanoparticles 412 retained within the nanoparticle heat sink 410. As described above, each loose optical fiber 408a-408g includes a respective fiber core 406a disposed therein. The nanoparticles 412 are formed against the complete outer surface of each optical fiber 408a-408g. In this manner, heat generated in response to an optical signal, such as laser light, traveling through a respective optical fiber 408a-408g is uniformly dissipated therefrom.

Figure 4E:
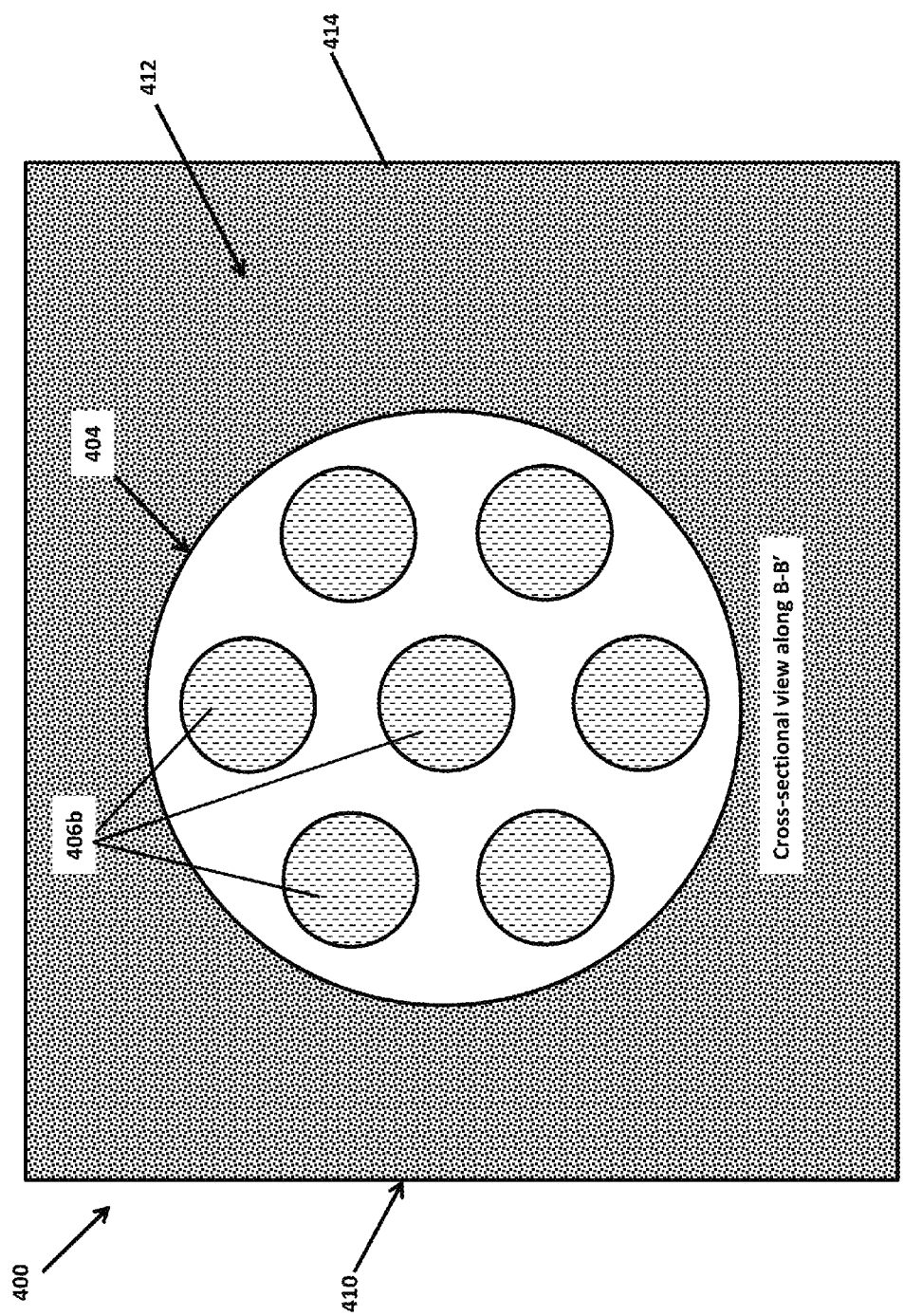
FIG. 4E is a cross-sectional view of the core portion of the optical fiber harness of FIG. 4C taken along line B-B' and showing the solid multi-core optical fiber embedded in the thermally conductive nanoparticles.

Referring to FIG. 4E, a cross-sectional view of an optical fiber harness 400 of FIG. 4C taken along line B-B' shows the solid multi-core optical fiber 404 embedded in the thermally conductive nanoparticles 412. As described above, the solid multi-core optical fiber 404 contains a plurality of bundled fiber cores 406b disposed therein. Each of the bundled fiber cores 406b included in the solid multi-core optical fiber 404 is spliced together with respective fiber cores 406a included in the frayed multi-core optical fiber 402. In this manner, the loose fiber cores 406a are essentially harnessed into a single grouping of fiber cores 406b within the solid multi-core optical fiber 404. In addition, that the nanoparticles 412 are formed directly against node 409 that splices together the frayed multi-core optical fiber 402 and the solid multi-core optical fiber 404. Accordingly, heat can be uniformly dissipated from the frayed multi-core optical fiber 402 and the solid multi-core optical fiber 404, and can also be effectively dissipated at one or more areas susceptible to localized heating such as, for example, the spliced node 409.

Figure 4F:
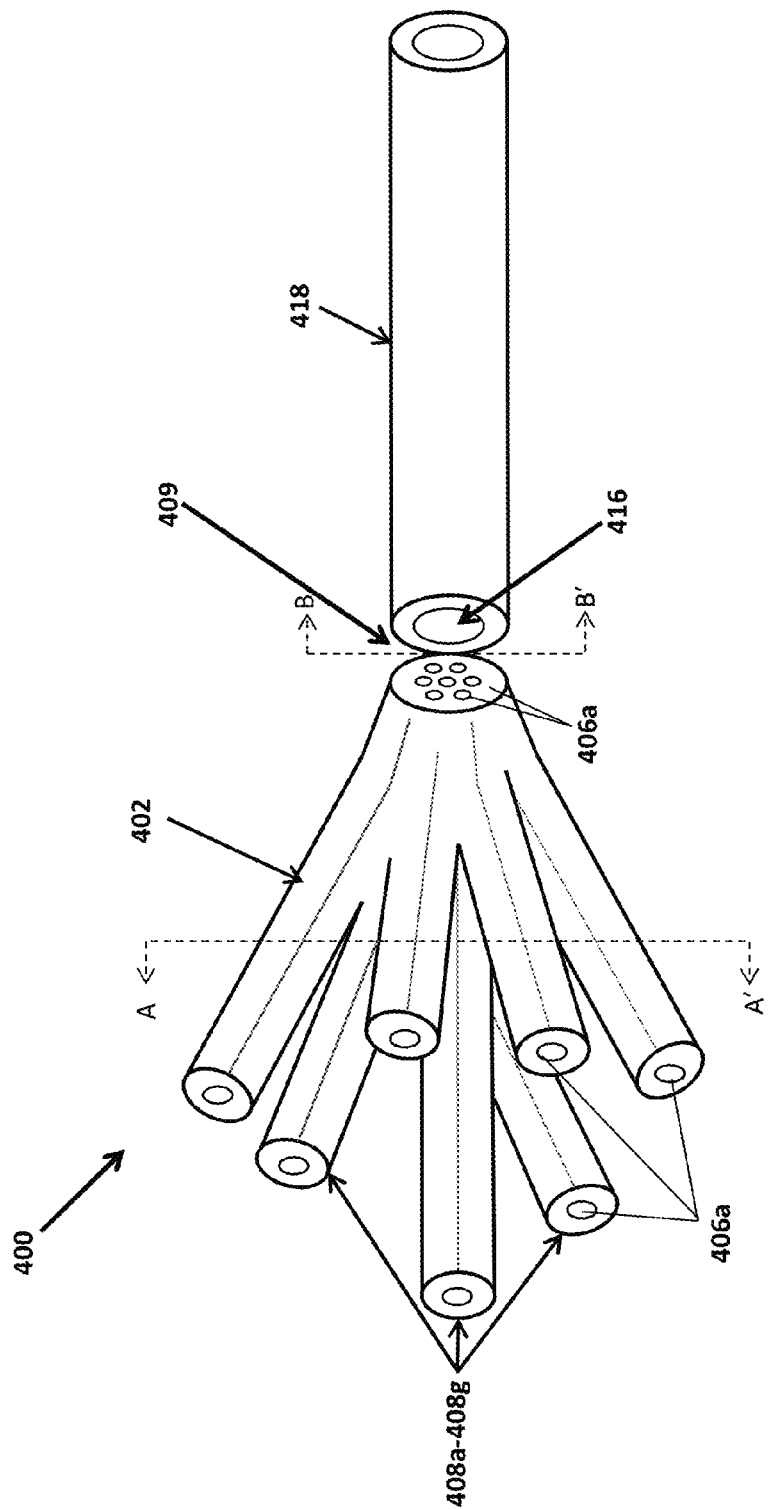
FIG. 4F is a disassembled view of an optical fiber harness including a frayed multi-core optical fiber having a plurality of loose fiber ends and a solid core optical fiber that can be spliced to the frayed multi-core optical fiber according to a non-limiting embodiment.

Turning to FIG. 4F, an optical fiber harness 400 is illustrated according to another embodiment. In this case, each loose fiber core 406a included in the frayed multi-core optical fiber 402 is spliced to a single core 416 included in a solid optical fiber portion 418 at the splice node 409. In this manner, the loose fiber cores 406a are essentially harnessed as single optical fiber core within the solid optical fiber 418.

Various embodiments of the invention described in detail above provide an optical fiber assembly such as one or more optical fibers, an optical coupler, optical isolators, tapers, etc., that includes a nanoparticle heat sink. The nanoparticle heat sink is formed against one or more localized heat-sensitive areas of an optical component such as, for example, an optical fiber. The nanoparticle heat sink contains a plurality of thermally conductive nanoparticles that can be retained against one or more of the localized heat-sensitive areas. In this manner, heat dissipation at the localized heat-sensitive areas is improved thereby reducing thermal stress and cracking realized by the optical fiber.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While various embodiments of the invention have been described, it will be understood that those skilled in the art, both now and in the future, may make various modifications and enhancements which fall within the scope of the claims which follow. These claims should be construed to maintain the proper protection for the invention first described.

What is claimed is:

1. An optical fiber assembly, comprising:
   at least one optical component configured to deliver light from a first end to a second end opposite the first end, the at least one optical component including at least one localized heat-sensitive area that emits increased temperatures with respect to remaining areas of the at least one optical fiber in response to light traveling through the localized heat-sensitive area; and
   a nanoparticle heat sink contacting the at least one optical component and completely surrounding the at least one localized heat-sensitive area, the nanoparticle heat sink configured to dissipate heat from the at least one optical component,
   wherein the at least one optical component includes a loose-end portion and a core portion, the loose-end portion including a plurality of loose optical fibers each having a respective loose fiber core disposed therein, and the core portion including a plurality of bundled fiber cores disposed therein, and wherein each loose fiber core is spliced to a respective bundled fiber core.

2. The optical fiber assembly of claim 1, wherein the nanoparticle heat sink covers at least a portion of the loose-end portion and at least a portion of the core end.

3. The optical fiber assembly of claim 2, wherein a portion of the thermally conductive nanoparticles are disposed in voids between the loose optical fibers.

4. The optical fiber assembly of claim 3, wherein the loose-end nanoparticle heat sink and the core nanoparticle heat sink each include a plurality of nanoparticles, the nanoparticles selected from a group comprising copper (Cu), a nickel-cobalt ferrous alloy, and diamond.

5. The optical fiber assembly of claim 4, wherein the nanoparticles have a first thermal coefficient of expansion that matches a second thermal coefficient of expansion corresponding to the material of the first and second optical fibers.

* * * * *